(12) United States Patent
Tanaka et al.

(10) Patent No.: US 6,476,676 B1
(45) Date of Patent: Nov. 5, 2002

(54) SEMICONDUCTOR INTEGRATED CIRCUIT

(75) Inventors: Satoshi Tanaka, Kokubunji; Shigetaka Takagi; Nobuo Fujii, both of Tokyo, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/889,154

(22) PCT Filed: Jan. 17, 2000

(86) PCT No.: PCT/JP00/00172

§ 371 (c)(1),
(2), (4) Date: Jul. 12, 2001

(87) PCT Pub. No.: WO00/44090

PCT Pub. Date: Jul. 27, 2000

(30) Foreign Application Priority Data

Jan. 19, 1999 (JP) .......................................... 11-010174

(51) Int. Cl.⁷ ............................................... H03F 3/45
(52) U.S. Cl. ...................... 330/258; 330/303; 327/552; 327/563
(58) Field of Search ............................. 330/258, 303; 327/552, 563

(56) References Cited

U.S. PATENT DOCUMENTS

| | | | | |
|---|---|---|---|---|
| 3,566,298 A | * | 2/1971 | Stevens ........................ | 330/84 |
| 4,088,961 A | * | 5/1978 | Ashley ........................ | 330/258 |
| 5,990,743 A | * | 11/1999 | Gabara ........................ | 330/258 |
| 6,160,446 A | * | 12/2000 | Azimi et al. ................. | 330/258 |

FOREIGN PATENT DOCUMENTS

| | | |
|---|---|---|
| JP | 7-283690 | 10/1995 |
| JP | 8-139534 | 5/1996 |
| JP | 9-8570 | 1/1997 |
| JP | 10-32439 | 2/1997 |
| JP | 10-41782 | 2/1998 |

OTHER PUBLICATIONS

IEEE Journal of Solid State Circuits, vol. 27, No. 2, Feb. 1992, "A CMOS Transconductance–C Filter Technique for Very High Frequencies", B. Nauta, pp. 142–153.

IEICE, Trans. Fundamentals, vol. E83–A, No. 2, Feb. 2000, "A BiCMOS Seventh–Order Lowpass Channel–Select Filter Operating at 2.5V Supply for a Spread–Spectrum Wireless Receiver", M. Jeong et al, pp. 210–219.

* cited by examiner

Primary Examiner—Michael B Shingleton
(74) Attorney, Agent, or Firm—Mattingly, Stanger & Malur, P.C.

(57) ABSTRACT

When an input signal to be amplified is very small and a large blocking signal having a high frequency is included in an input, it is necessary for a filter for mobile communication for removing thereof that a common-mode signal rejection ratio is large. Further, even in the case of an amplifier having a high gain, it is preferable that the common-mode rejection ratio is large in order to avoid saturation of the amplifier by noise. A common-mode rejecting characteristic is added to an input stage by making transconductance circuits of an input of an integrating circuit proposed by Nauta differential circits and connecting thereof in cross connection. Thereby, a filter as well as an amplifier improving the common-mode rejection ratio of a total, are realized by being applied to a CMOS process or a BiCMOS process.

16 Claims, 17 Drawing Sheets

SEMICONDUCTOR INTEGRATED CIRCUIT

TECHNICAL FIELD

The present invention relates to a semiconductor integrated circuit excellent in a common-mode rejection ratio for improving a common-mode rejection ratio of a circuit of an integrated amplifier, integrator, filter or the like.

BACKGROUND ART

Balanced signal processing (differential signal processing) is one of circuit technologies effective in being used for increasing a dynamic range of an analog block. The differential signal processing is not only provided with high capability of rejecting common-mode noise such as power source coupling, blocking signal inputted in a common mode but also provided with various advantages in comparison with an unbalanced type signal processing such as restraint of harmonic components at even number orders or flexibility in design.

However, in designing a differential type circuit, feedback for a differential signal does not effect influence on an output of a common-mode component and consequently, a common-mode signal stays in an open loop and an output potential is not determined. Therefore, in order to maintain a common-mode output voltage at certain reference voltage, other negative feedback loop must be included in a common-mode signal path so that the level of the common-mode output voltage is fixed to the potential.

Generally, it is difficult to design the newly added feedback loop for the common-mode signal, depending on cases, the circuit may be brought into an unstable state. In order to resolve the problem, there have been proposed several circuits which does not use the feedback loop for a common-mode signal. As a representative conventional example, there is pointed out B. Nauta, "A CMOS transconductance-C filter technique for very high frequencies", IEEE J. Solid-State Circuits vol.27, No.2 pp. 142–153, February 1992. FIG. 2 shows an integrator for a filter proposed by Nauta. Although a detailed description will be given later of the operation principle, according to the circuit, a common-mode component cannot be rejected completely and the common-mode rejection ratio is restricted even in an ideal state in which a variation in elements is not included.

DISCLOSURE OF INVENTION

When an input signal to be amplified is very small, there is included large blocking signal having a high frequency in an input and there is constituted a filter for mobile communication for rejecting thereof, suppression of the blocking signal becomes insufficient when the common-mode signal rejection ratio is small. Further, in consideration of constituting an amplifier having a high gain, in order to avoid saturation by common-mode noise, it is necessary to improve the common-mode rejection ratio. From the above-described, it is a problem of the present invention to realize a differential circuit for significantly reducing a common-mode gain.

In order to achieve the above-described problem, according to the present invention, transconductance circuits of an input of an integrating circuit proposed by Nauta are made to be differential circuits and are connected in cross connection. Thereby, there can be added a common-mode rejection characteristic at an input stage and the common-mode rejection ratio of a total is improved.

BEST MODE FOR CARRYING OUT THE INVENTION

Figure 1:
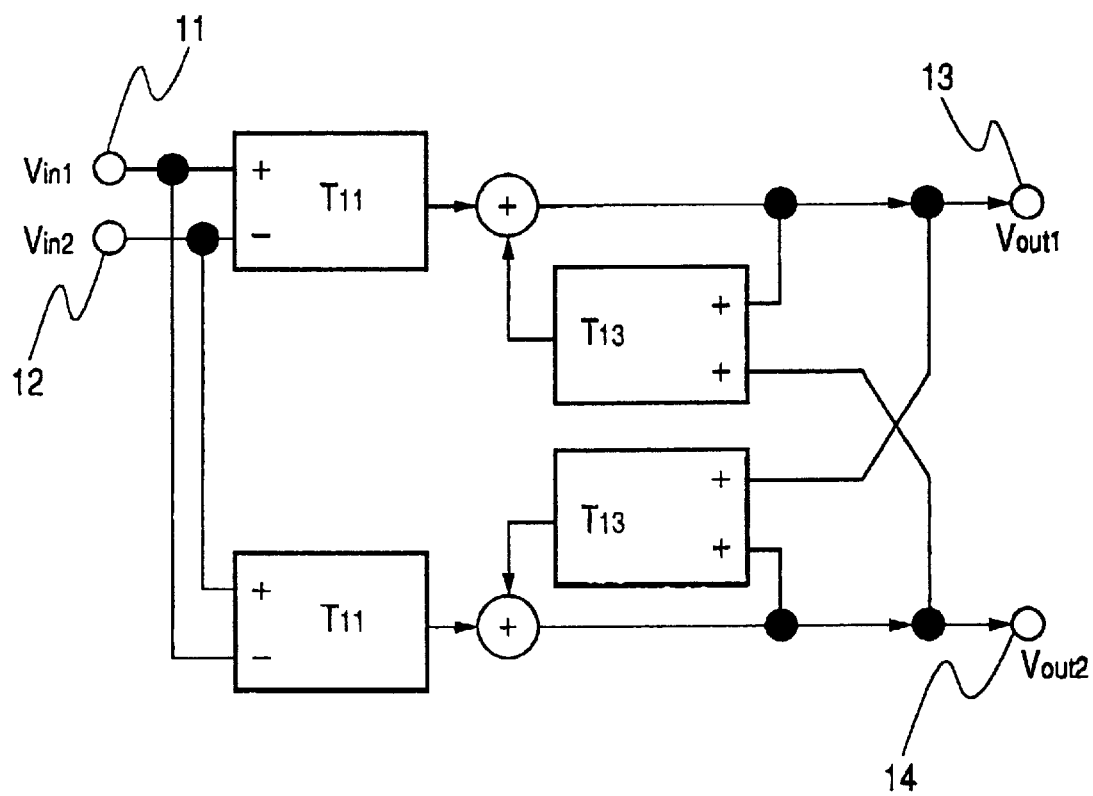
FIG. 1 is a basic block diagram of a first embodiment according to the present invention.

A detailed explanation will be given of specific embodiments of the present invention in reference to the drawings as follows.

Notations in the drawings are as follows.

Numerals 11 and 12 designate input terminals, numerals 13 and 14 designate output terminals, numerals 21 and 22 designate input terminals, numerals 23 and 24 designate output terminals, numeral 25 designates a single end transconductor $g_{m1}$, numeral 26 designates a detailed circuit of a signal end transconductor, numeral 27 designates a single end transconductor $g_{m2A}$, numeral 28 designates a single end transconductor $g_{m2B}$, numerals 31 and 32 designate input terminals, numerals 33 and 34 designate output terminals, numerals 41 and 42 designate input terminals, numerals 43 and 44 designate output terminals, numeral 45 designates a load impedance $Z_f$, numeral 46 designates a differential input single output transconductor $g_{m13A}$, numeral 47 designates a differential input single output transconductor $g_{m13B}$, numerals 48 and 49 designate sums of output current, numeral 40 designates a transfer function $T_{11}$, numeral 51 designates a differential input single output transconductor $g_{m2A}$, numeral 52 designates a differential input single output transconductor $g_{m2B}$, numeral 53 designates a capacitor, numerals 61 and 62 designate resistors, numeral 63 designates a transistor, numeral 71 designates a differential input single output transconductor $g_{m4A}$, numeral 72 designates a differential input single output transconductor $g_{m4B}$, numerals 73 and 74 designate nodes, numerals 81 and 82 designate input terminals, numeral 83 designates an output terminal, numeral 84 designates ground potential VSS, numeral 85 designates power source potential VDD, numerals 91 and 92 designate one end grounded differential input terminals, numerals 93 and 94 designate a differential input terminal pair, numeral 95 designates a differential 3input transconductor, numerals 101, 102, 103, 104 designate differential input terminals, numeral 105 designates a single output terminal, numerals 106, 107, 108, 109 designate bias control terminals, numeral 1101 designates a differential 3input transconductor, numeral 1102 designates a differential 2 input transconductor, numerals 1103 and 1104 designate input terminals, numerals 1105 and 1106 designate output terminals, numeral 1201 designates a coupling resistor, numeral 1202 designates a transistor, numeral 1203 designates a differential 2 input transconductor, numeral 1301 designates an antenna, numeral 1302 designates a received signal, numeral 1303 designates an in-band blocking signal, numeral 1304 designates an off-band blocking signal, numeral 1305 designates a first bandpass filter, numeral 1306 designates a low noise amplifier, numeral 1307 designates a first band pass filter, numeral 1308 designates a mixer circuit, numeral 1309 designates an intermediate frequency band pass filter, numeral 1310 designates a modulator, numeral 1311 designates an I signal, numeral 1312 designates a Q signal, numeral 1313 designates a base band filter circuit, numeral 1401 designates a first order low-pass filter, numeral 1402 designates a second order notch filter, numeral 1403 designates a first order high-pass filter, numeral 1404 designates a third order leap-frog type low-pass filter, numeral 1405 designates a first order all-pass filter, numeral 1501 designates a signal source impedance, numeral 1502 designates a resistor, numeral 1503 designates a capacitor, numeral 1504 designates a buffer amplifier, numeral 1701 designates a differential operational amplifier, numeral 1702 designates a buffer amplifier, numerals 1703 and 1704 designate resistors, numeral 1705 designates a capacitor, numeral 1801 designates a transconductor, numeral 1802 designates a buffer amplifier and numeral 1803 designates a capacitor.

An explanation will be given of a first embodiment of the present invention in reference to FIGS. 1, 2, 3, 4, 5 and 6. First, consider a circuit shown by FIG. 3 in order to investigate a general circuit having a symmetrical structure. FIG. 3 shows a circuit of 2 inputs and 2 outputs in which inputs are designated by numerals 31 and 32 ($v_{in1}$, $v_{in2}$) and outputs are designated by numerals 33 and 34 ($v_{out1}$, $v_{out2}$). The outputs $v_{out1}$ and $v_{out2}$ are represented as follows by using inputs $v_{in2}$ and $v_{in2}$ also in consideration of feedback therefrom.

$$v_{out1} = T_{11}v_{in1} + T_{12}v_{in2} + T_{13}v_{out1} + T_{14}v_{out2} \quad \text{(Equation 1)}$$

$$v_{out2} = T_{21}v_{in1} + T_{22}v_{in2} + T_{23}v_{out1} + T_{24}v_{out2} \quad \text{(Equation 2)}$$

In these equations, notation $T_{ij}$ designates transfer functions from input or output to respective outputs. There are derived conditions for constituting respectively desired transfer characteristics by transfer characteristic with regard to differential components and common-mode components. First, based on the above-described equations, there is calculated a characteristic with regard to a differential signal. Differential output voltage $v_{outd}=v_{out1}-v_{out2}$, becomes as follows from (Equation 1) and (Equation 2).

$$v_{outd} = (T_{11} - T_{21})v_{in1} + (T_{12} - T_{22})v_{in2} + \quad \text{(Equation 3)}$$
$$(T_{13} - T_{23})v_{out1} + (T_{14} - T_{24})v_{out2}$$

In this case, in order that $v_{outd}$ becomes a function of only differential input voltage $v_{ind}=v_{in2}-v_{in2}$, the following relationships are needed.

$$T_{11} - T_{21} = -T_{12} + T_{22} \quad \text{(Equation 4)}$$

$$T_{13} - T_{23} = -T_{14} + T_{24} \quad \text{(Equation 5)}$$

At this occasion, (Equation 3) becomes as follows.

$$v_{outd} = v_{out1} - v_{out2} = \frac{T_{11} - T_{21}}{1 - T_{13} + T_{23}} v_{ind} \quad \text{(Equation 6)}$$

Next, a characteristic with regard to a common-mode signal is calculated. Common-mode output voltage $v_{outc}=v_{out1}+v_{out2}$ becomes as follows from (Equation 1) and (Equation 2).

$$v_{outc} = (T_{11} + T_{21})v_{in1} + (T_{12} + T_{22})v_{in2} + \quad \text{(Equation 7)}$$
$$(T_{13} + T_{23})v_{out1} + (T_{14} + T_{24})v_{out2}$$

In this case, in order that $v_{outc}$ is constituted by a function of only common-mode input voltage $v_{inc}=v_{in1}+v_{in2}$, the following relationships are needed.

$$T_{11} + T_{21} = T_{12} + T_{22} \quad \text{(Equation 8)}$$

$$T_{13} + T_{23} = T_{14} + T_{24} \quad \text{(Equation 9)}$$

At this occasion, (Equation 7) becomes as follows.

$$v_{outc} = v_{out1} + v_{out2} = \frac{T_{11} + T_{21}}{1 - T_{13} - T_{23}} v_{inc} \quad \text{(Equation 10)}$$

When all of (Equation 4), (Equation 5), (Equation 8) and (Equation 9) are established, there are derived equivalent conditions as follows.

$$T_{11} = T_{22}, T_{12} = T_{21}, T_{13} = T_{24}, T_{14} = T_{23} \quad \text{(Equation 11)}$$

Here, as an example, consider to realize a differential filter. In the differential filter, it is preferable that a common-mode signal output is null. Hence, in order that a transfer function from the common-mode input signal $v_{inc}$ to the common-mode output signal $v_{outc}$, is null, the following relationship must be established.

$$T_{11} = -T_{21}(=T_{22}=-T_{12}) \quad \text{(Equation 12)}$$

Further, in order that a characteristic from the differential input signal $V_{ind}$ to the differential output signal $V_{outd}$ is constituted by a desired transfer function $T_0$, (Equation 13) may be satisfied as follows.

$$\frac{T_{11}-T_{21}}{1-T_{13}+T_{23}} = \frac{2T_{11}}{1-T_{13}+T_{23}} = T_0 \quad \text{(Equation 13)}$$

Further, when the following relationship is established for simplicity, $$T_{13} = T_{23} \quad \text{(Equation 14)}$$

the following relationship is established.

$$2T_{11} = T_0 \quad \text{(Equation 15)}$$

By substituting (Equation 11), (Equation 12) and (Equation 14) which are condition equations in which common-mode output voltage does not appear and in which differential output voltage is a function of only differential input voltage, for (Equation 1) and (Equation 2), the outputs $v_{out1}$ and $v_{out2}$ are as follows.

$$v_{out1} = T_{11}(v_{in1} - v_{in2}) + T_{13}(v_{out1} + v_{out2}), \quad \text{(Equation 16)}$$

$$v_{out2} = T_{11}(v_{in2} - v_{in1}) + T_{13}(v_{out1} + v_{out2}) \quad \text{(Equation 17)}$$

From the above-described, FIG. 1 is provided as a total block diagram.

In constituting the circuits, a condition for stabilizing the circuit is indispensable other than (Equation 11), (Equation 12) and (Equation 14). There are derived equations showing the conditions that the differential circuit structure of FIG. 1 is stable. When there are calculated transfer characteristics from respective inputs 11 and 12 to outputs 13 and 14 ($v_{out1}$, $v_{out2}$) based on (Equation 1) and (Equation 2), the following relationships are established.

$$v_{out1} = \frac{T_A v_{in1} + T_B v_{in2}}{(1-T_{13})(1-T_{24}) - T_{14}T_{23}} \quad \text{(Equation 18)}$$

$$v_{out2} = \frac{T_C v_{in1} + T_D v_{in2}}{(1-T_{13})(1-T_{24}) - T_{14}T_{23}} \quad \text{(Equation 19)}$$

In these equations, notations $T_A$, $T_B$, $T_C$ and $T_D$ are represented as follows.

$$T_A = T_{11} - T_{11}T_{24} + T_{14}T_{21}, \quad \text{(Equation 20)}$$

$$T_B = T_{12} - T_{12}T_{24} + T_{14}T_{22},$$

$$T_C = T_{21} - T_{21}T_{13} + T_{23}T_{11},$$

$$T_D = T_{22} - T_{22}T_{13} + T_{23}T_{12}$$

At this occasion, respective $T_{ij}$ is designed to satisfy the following relationships which are in relationships of sufficient conditions with regard to (Equation 11) and (Equation 12).

$$T_{11} = T_{22} = -T_{12} = -T_{21} = \frac{N_{11}}{D_A} \quad \text{(Equation 21)}$$

$$T_{13} = T_{24} = T_{14} = T_{23} = \frac{N_{13}}{D_B} \quad \text{(Equation 22)}$$

Incidentally, $N_{11}$, $N_{13}$, $D_A$ and $D_B$ are polynomials of Laplacian variable s. When the sufficient conditions are substituted for (Equation 18) and (Equation 19), the following relationships are provided.

$$v_{out1} = \frac{N_{11}(D_B - 2N_{13})v_{in1}}{D_A(D_B - 2N_{13})} - \frac{N_{11}(D_B - 2N_{13})v_{in2}}{D_A(D_B - 2N_{13})} = \quad \text{(Equation 23)}$$
$$\frac{N_{11}}{D_A}(v_{in1} - v_{in2}),$$

$$v_{out2} = \frac{-N_{11}(D_B - 2N_{13})v_{in1}}{D_A(D_B - 2N_{13})} + \frac{N_{11}(D_B - 2N_{13})v_{in2}}{D_A(D_B - 2N_{13})} = \quad \text{(Equation 24)}$$
$$\frac{-N_{11}}{D_A}(v_{in1} - v_{in2}),$$

From these equations, the condition that the circuit of FIG. 1 is stable, resides in satisfying conditions of Hurwitz polynomial in which real parts of Eigen values of $D_A$ and $D_B - 2N_{13}$ become negative. Notation $D_A$ designates a denominator polynomial of a desired transfer function and accordingly is Hurwitz polynomial. Therefore, when ($D_B - 2N_{13}$) is selected to be Hurwitz polynomial, the differential circuit of FIG. 1 is stable.

Figure 4:
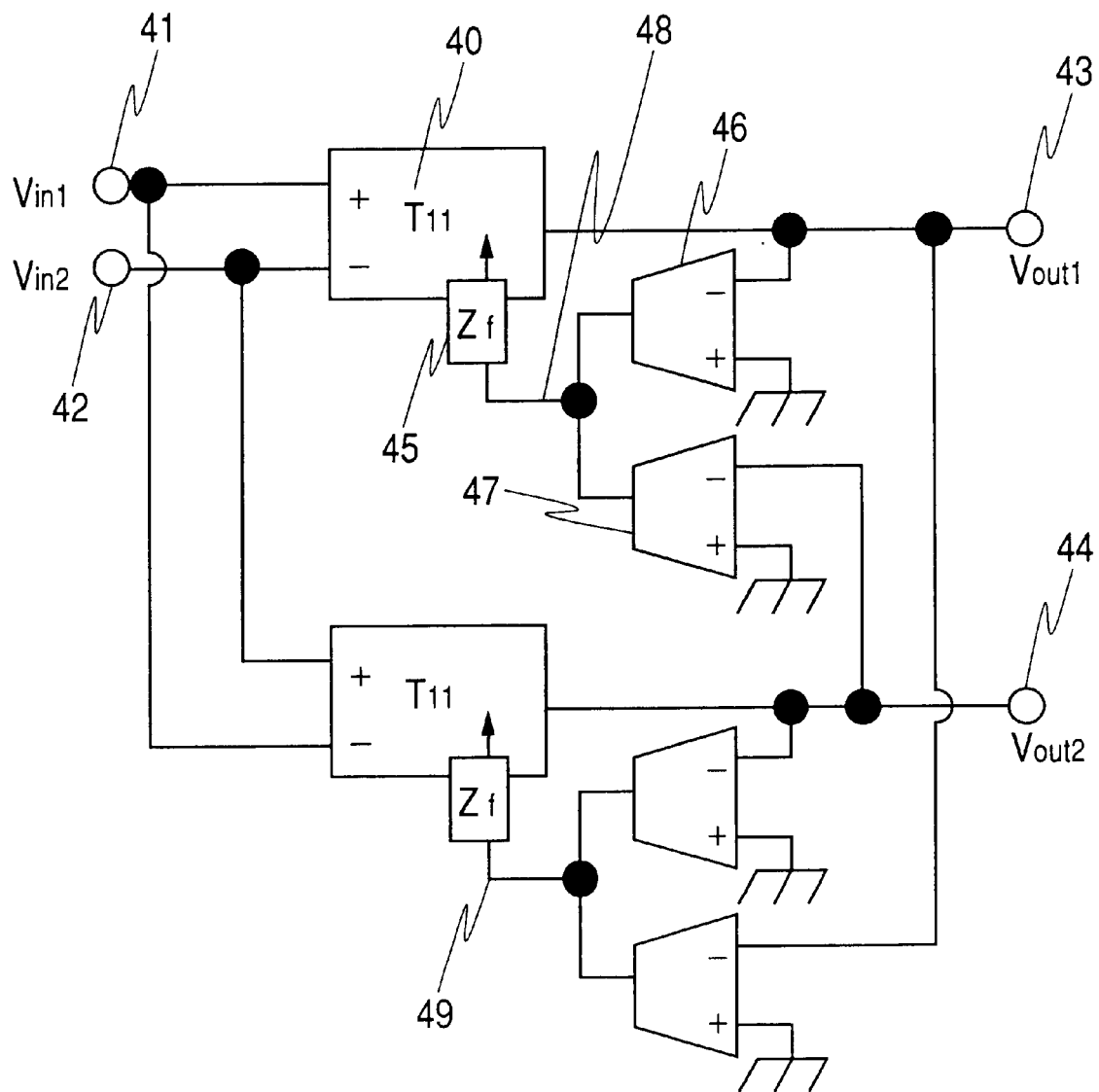
FIG. 4 is a block diagram of the first embodiment of the present invention having a feedback circuit by transconductance.

A further detailed description will be given of a method of realizing the circuit of FIG. 1. Various differential circuits can be derived from the circuit structure of FIG. 1. A degree of freedom is constituted in a way of selecting the function $T_{13}$, and accordingly, a performance and a circuit scale of a total circuit differ by what function is selected. FIG. 4 shows a constitution example realizing $T_{13}$ by two of OTAs (Operational Transconductance Amplifier, hereinafter, abbreviated as OTA). In FIG. 4, notation $T_{11}$ designates a transfer function from plus and minus input terminals 41 and 42 to output nodes 43 and 44. Notation $Z_f$ designates a transimpedance 45 from sums 48 and 49 ($i_{oj}$(j=1,2)) of output currents of transconductances 46 ($g_{m13A}$) and 47 ($g_{m13B}$) to the output nodes 43 and 44. In this case, $T_{13}$ is given as $-Z_f g_m$ when $g_{m13A}=g_{m13B}=g_m$.

In an integrated circuit, element values of elements having the same structure excellently coincide with each other, however, more or less mismatch is produced by a process condition. (Equation 16) and (Equation 17) show that when the element values are completely matched, that is, transfer functions $T_{11}$ and $T_{13}$ in the two equations coincide with each other, the common-mode gain becomes null.

An investigation will be given of an influence when the mismatch is produced in the transfer function. (Equation 16) and (Equation 17) are modified and rewritten as follows.

$$v_{out1} = T_{11}(v_{in1} - v_{in2}) + T_{13}(v_{out1} + v_{out2}), \quad \text{(Equation 25)}$$

$$v_{out2} = T_{11p}(v_{in2} - v_{in1}) + T_{13p}(v_{out1} + v_{out2}) \quad \text{(Equation 26)}$$

In these equations, $T_{11p}$ and $T_{13p}$ in (Equation 26) show that an error is included in the transfer function. The common-mode output voltage $v_{outc}=v_{out1}+v_{out2}$, becomes as follows from (Equation 25) and (Equation 26).

$$v_{outc} = \frac{T_{11} - T_{11p}}{1 - T_{13} - T_{13p}}(v_{in1} - v_{in2}) = \frac{T_{11} - T_{11p}}{1 - T_{13} - T_{13p}} v_{ind} \quad \text{(Equation 27)}$$

Here, based on the constitution example of FIG. 4, when respectives of $T_{13}$ and $T_{13p}$ are defined as follows, $$T_{13} = -Z_f g_{m13}, \quad T_{13p} = -Z_f g_{m13p}, \quad \text{(Equation 28)}$$
$$g_{m13} > 0, \quad g_{m13p} > 0$$

$v_{outc}$ becomes as follows.

$$v_{outc} = \frac{T_{11} - T_{11p}}{1 + Z_f(g_{m13} + g_{m13p})} v_{ind} \quad \text{(Equation 29)}$$

As is apparent from (Equation 29), when $T_{11} \neq T_{11p}$, the common-mode output voltage $v_{outc}$ does not become null. When there is not a feedback circuit, from (Equation 16) and (Equation 17), even when $T_{13}=0$, the common-mode output voltage $v_{outc}$ becomes null and therefore, when $g_{m3}=g_{m3p}=0$, $v_{outc}$ becomes as follows.

$$v_{outc} = (T_{11} - T_{11p}) v_{ind} \quad \text{(Equation 30)}$$

For example, when a constitution of an integrator is considered, $T_{11}$ and $T_{11p}$ are realized to provide very large gains in direct current and therefore, a direct current differential component significantly changes the common-mode output component and normally, output is saturated. Meanwhile, for example, even in the case of mismatch, from (Equation 29), when $g_{m13}$ and $g_{m13p}$ are increased, the common-mode output voltage is monotonously reduced. Therefore, even when there is mismatch in element values constituting $T_{11}$ and $T_{11p}$ and the common-mode gain does not become null, by a feedback loop constituted by $T_{13}$, the common-mode component can sufficiently be reduced.

Figure 5:
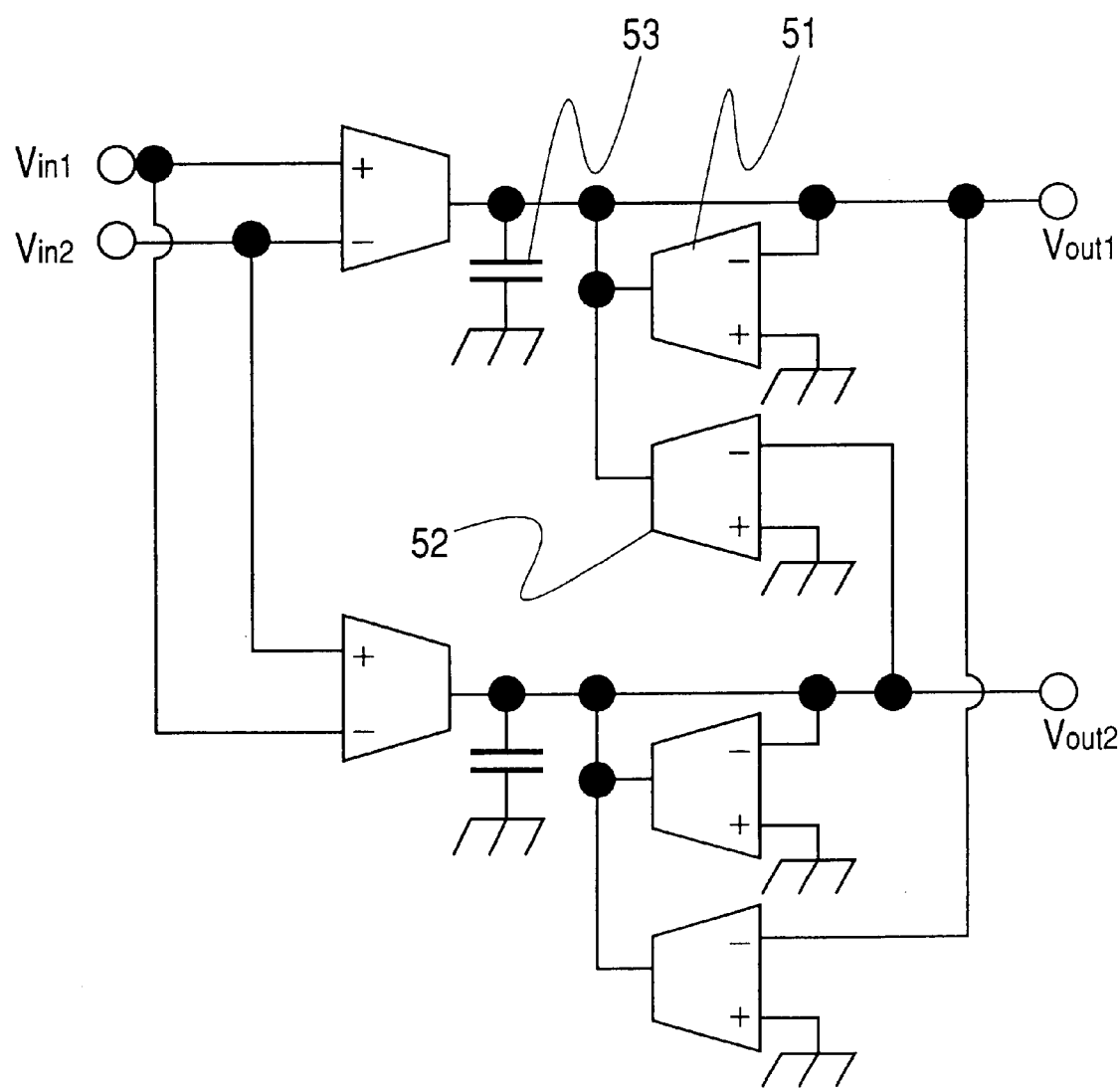
FIG. 5 is a block diagram showing an integrator to which the first embodiment of the present invention is applied.

FIG. 5 shows a circuit constitution in the case of connecting a capacitor 53 and constituting an integrator based on the constitution example of FIG. 4. The transfer functions $T_{11}$ and $T_{13}$ in this case are respectively as follows when $g_{m2A}=g_{m2B}=g_{m2}$ with regard to the transconductances 51 and 52 ($g_{m2A}$, $g_{m2B}$).

$$T_{11} = \frac{g_{m1}}{sC_1}, \quad T_{13} = -\frac{g_{m2}}{sC_1} \quad \text{(Equation 31)}$$

A detailed description will be given of a difference between the circuit constitution of the present invention shown in FIG. 4 and that of the conventional example shown in FIG. 2. Both are provided with feedback loops constituted by $g_{m2A}$ and $g_{m2B}$ similarly and the effect is also the same. A difference therebetween resides in that OTA on the input side are provided with two inputs and there is outputted current in proportion to voltage between input terminals. By connecting the inputs in cross connection, the common-mode input signals are canceled by each other. In order to show the difference, there is calculated a transfer function from an input signal to an output signal according to the conventional example of FIG. 2. First, for simplicity, when $g_{m1}=g_{m2A}=g_{m2B}=g_m$, the outputs $v_{out1}$ or $v_{out2}$ are represented as follows.

$$v_{out1} = -\frac{g_m}{sC}\left(v_{inc} + \frac{v_{ind}}{2} + v_{out1} + v_{out2}\right) \quad \text{(Equation 32)}$$

$$v_{out2} = -\frac{g_m}{sC}\left(v_{inc} - \frac{v_{ind}}{2} + v_{out1} + v_{out2}\right) \quad \text{(Equation 33)}$$

From (Equation 32) and (Equation 33), the differential output voltage $v_{outd}$ and the common-mode output voltage $v_{outc}$ become as follows.

$$v_{outd} = v_{out1} - v_{out2} = -\frac{g_m}{sC} v_{ind} \quad \text{(Equation 34)}$$

$$v_{outc} = v_{out1} + v_{out2} = -\frac{2g_m}{sC + 2g_m} v_{inc} \quad \text{(Equation 35)}$$

Figure 2:
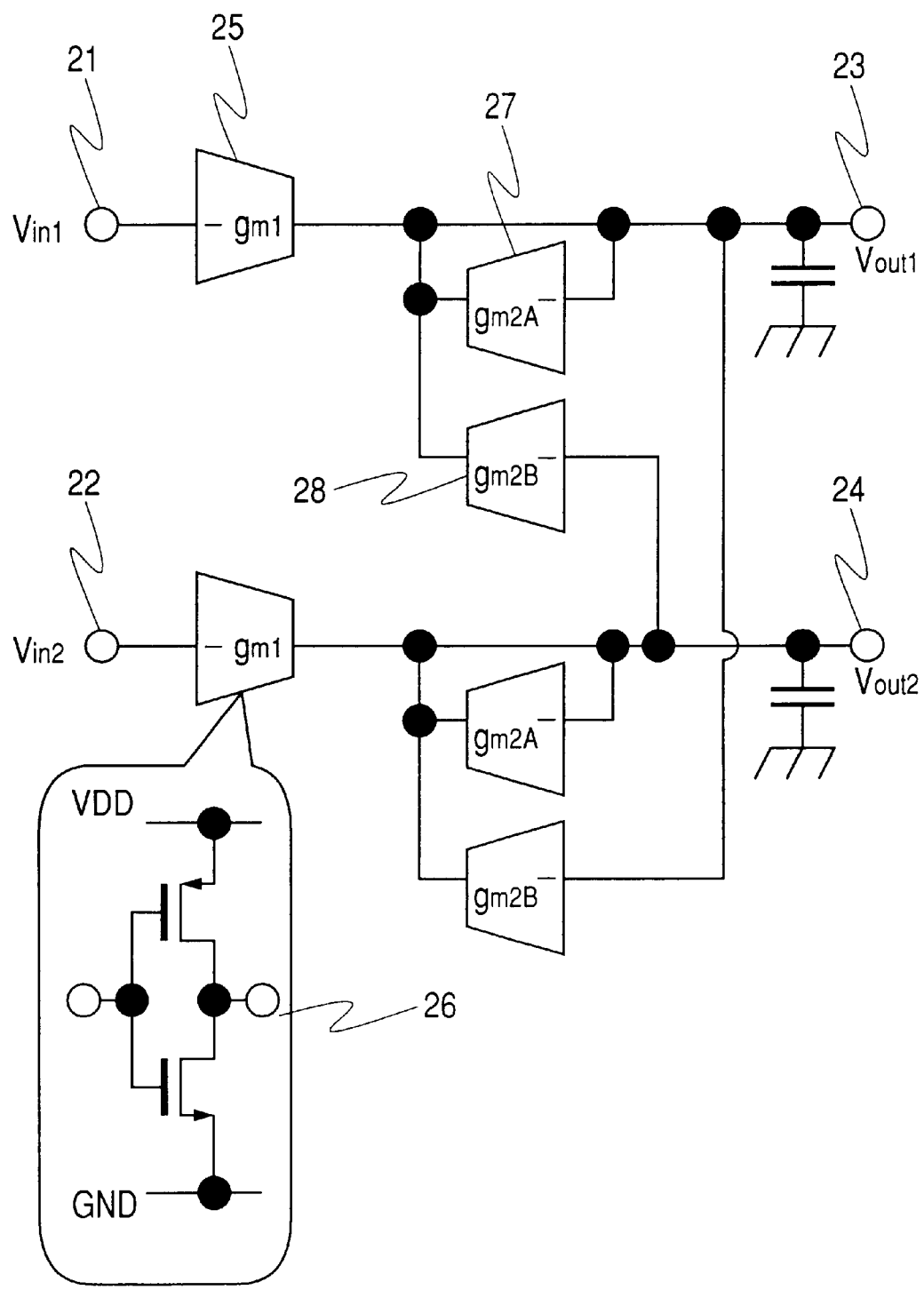
FIG. 2 is a block diagram showing an integrator to which a conventional differential transconductance circuit is applied.
Figure 3:
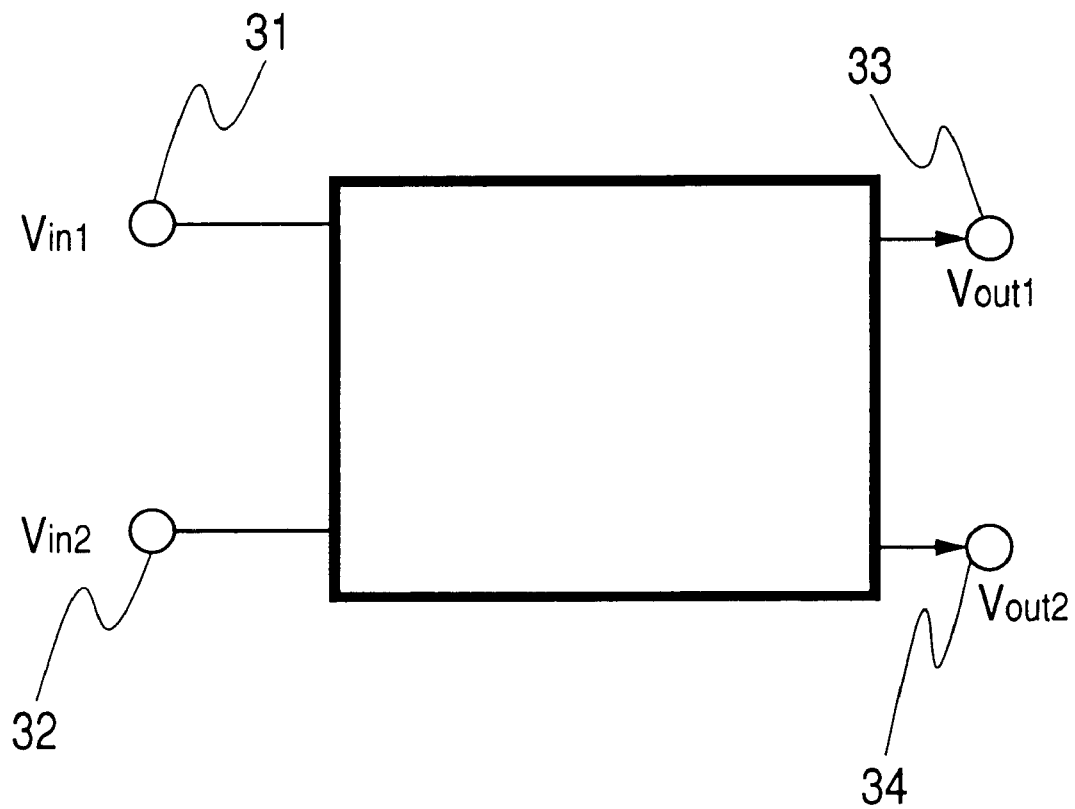
FIG. 3 is a general block diagram for inputting and outputting differential signals.

As is apparent from (Equation 35), according to the differential integrator circuit of FIG. 2, the transfer function from the common-mode input signal $v_{inc}$, to the common-mode output signal $v_{outc}$ is not null and therefore, a common-mode component of the input is outputted.

In FIG. 5, self feedback of $g_{m2A}$ can be realized by one resistor and when influence of base current of the transistor and emitter resistance thereof are disregarded because of a voltage control current source, $g_{m2B}$ can be realized by a single resistor and a single transistor.

Figure 6:
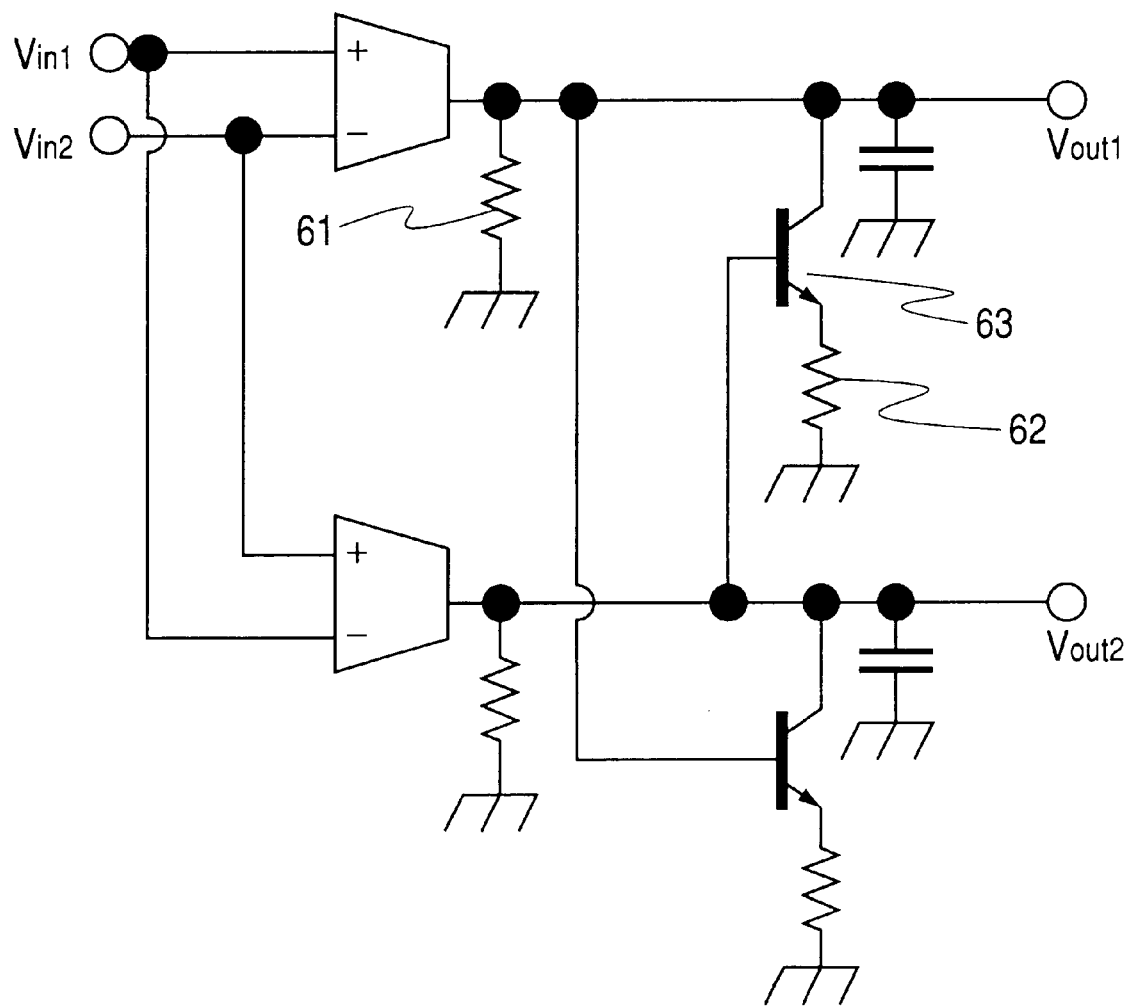
FIG. 6 is a block diagram showing the integrator according to the first embodiment of the present in which a feedback circuit is constituted by transistors and resistors.

FIG. 6 shows a circuit constitution in which $g_{m2A}$ and $g_{m2B}$ constituting $T_{13}$ are replaced by a resistor and a transistor. According to the circuit constitution of FIG. 6, two transistors 63 constitute a differential negative impedance converter and when $g_{m2A}=g_{m2B}$, the negative resistor 61 ($1/g_{m2A}$) of OTA and negative resistance $-1/g_{m2B}$ generated by the transistor 63, are canceled by each other. Thereby, there can be realized an integrator improving the common-mode rejection ratio by a simple element constitution in accordance with the embodiment. Further, the circuit of the embodiment can also be used as a voltage amplifier by replacing load not by a capacitor but by a resistor.

A description will be given of a second embodiment according to the present invention in reference to FIGS. 7 and 8. In this case, consider to realize a filter circuit having a large common-mode rejection ratio by designating a transfer function of a filter by notation $T_{11}$.

From (Equation 15), $T_0=2T_{11}$ and therefore, when a filter is constituted by setting the integrator as $T_{11}$, a value of $g_m$ is doubled and by that amount, a capacitor necessary for providing the same time constant is also doubled. In contrast thereto, when the transfer function of the filter is directly realized as $T_{11}$, the filter transfer function is doubled and therefore, although direct current gain of the filter is increased by 6 dB, a capacitance value necessary for realizing the same filter transfer function is halved in comparison with that in the case of constituting the integrator as $T_{11}$.

Further, whereas there is needed OTA for realizing $T_{13}$ for respective integrator according to the constitution of FIG. 5, when the filter transfer function is directly realized as $T_{11}$, the filter can be constituted by a smaller number of OTA.

Figure 7:
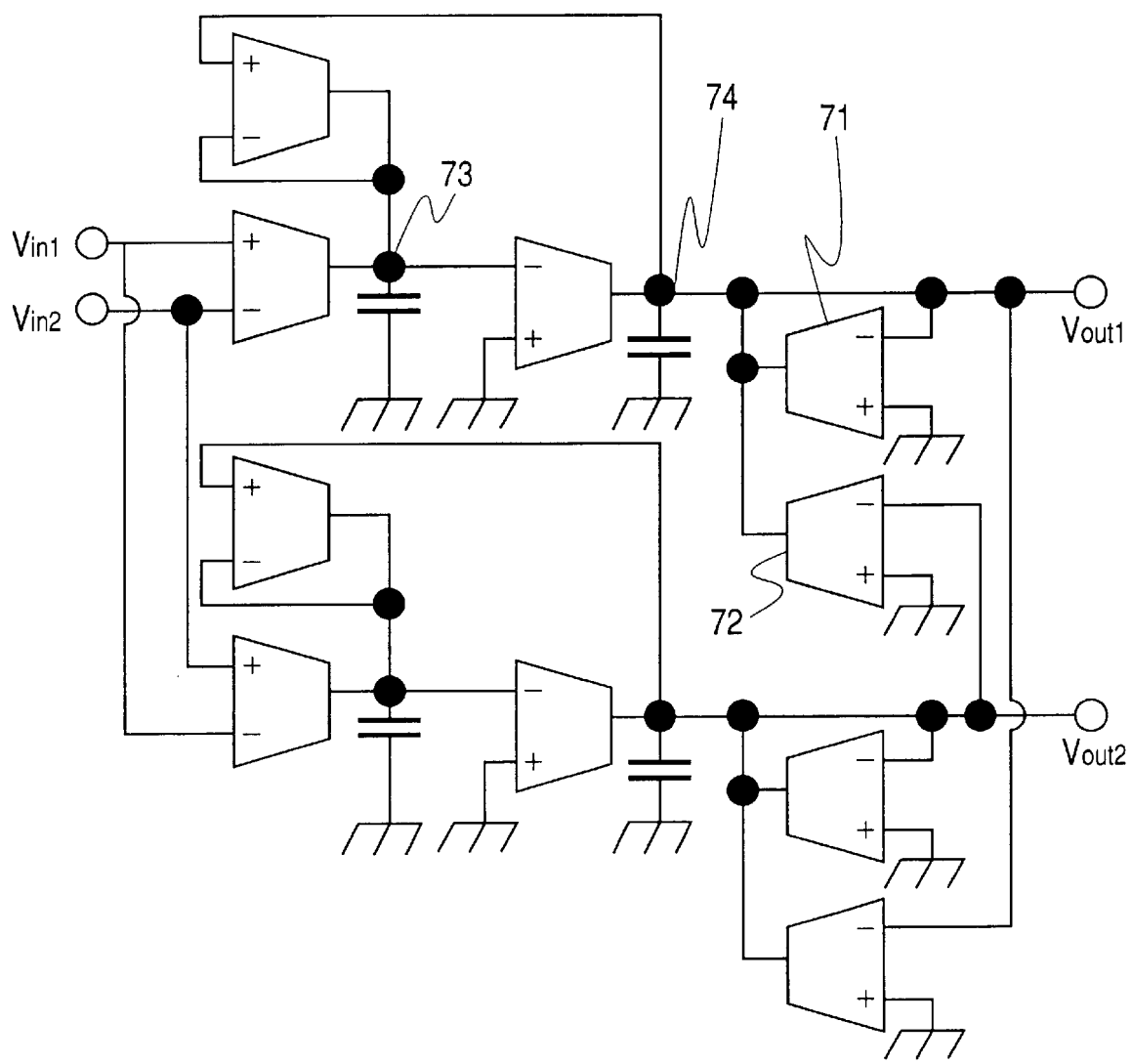
FIG. 7 is a block diagram of a second embodiment according to the present invention in which a filter is fed back.
Figure 8:
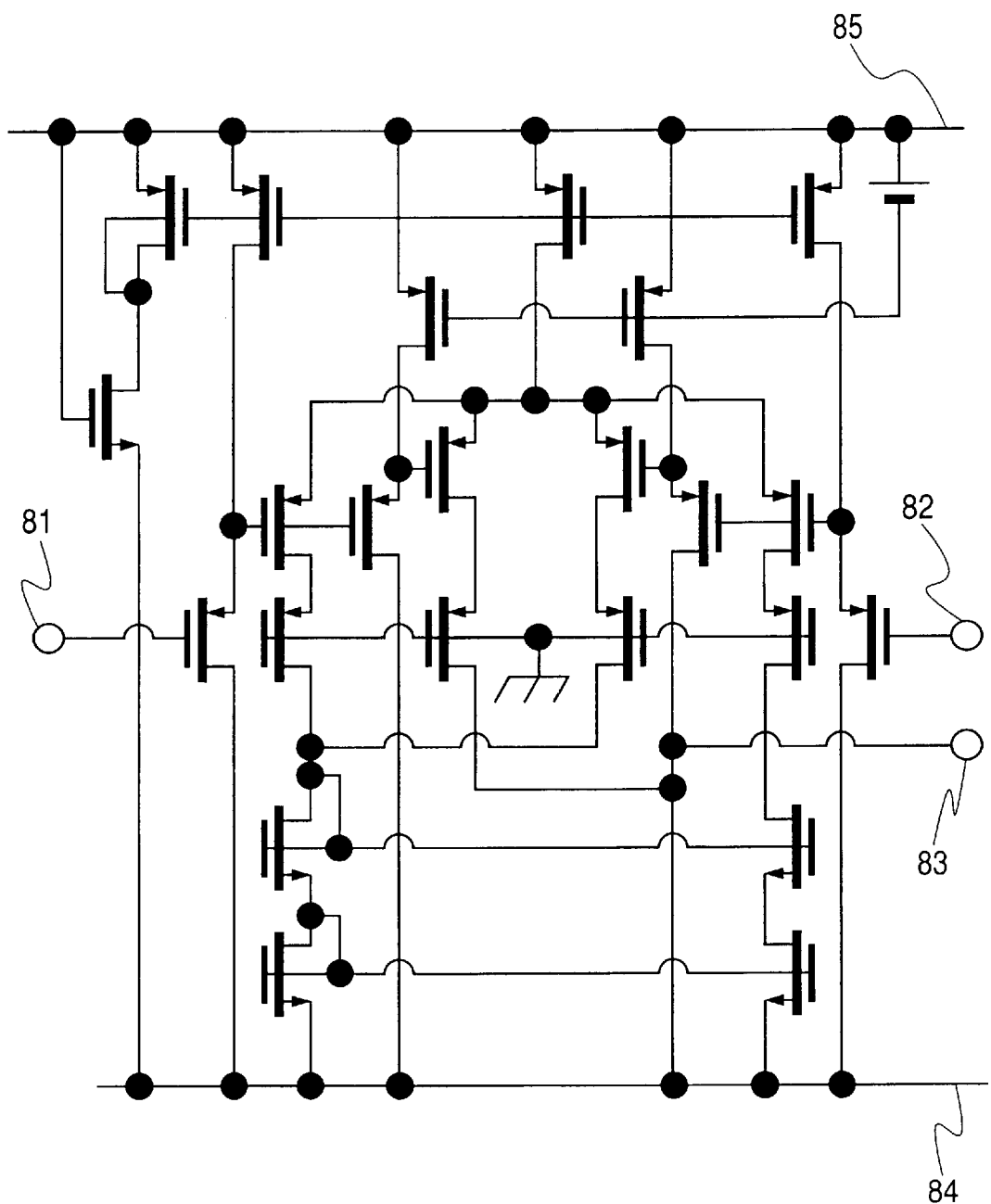
FIG. 8 is a circuit diagram showing widely-known CMOSOTA used for verifying by a simulation of the second embodiment of the present invention.

FIG. 7 shows a differential second order low-pass filter with a second order filter as a basic building block. Even when a sum i0j (j=1,2) of output currents of transconductances 71 and 72 ($g_{m4A}$ and $g_{m4B}$) constituting $T_{13}$, is connected to either of nodes 73 and 74, the effect as $T_{13}$ stays almost the same and therefore, in this case, an investigation will be given in the case in which the sum is connected to the node 74, that is, to an output terminal of the filter.

First, the stability is investigated. In FIG. 7, when $g_{m4A}=g_{m4B}=g_{m4}$, $T_{13}$ is calculated as follows.

$$T_{13} = \frac{N_{13}}{D_B} = \frac{-C_1 g_{m4} s - g_{m2} g_{m4}}{C_1 C_2 s^2 + C_2 g_{m2} s + g_{m2} g_{m3}} \quad \text{(Equation 36)}$$

$D_B$ is the same as $D_A$ and therefore, $D_B$ is always Hurwitz polynomial. Therefore, with regard to $D_B - 2N_{13}$ for determining the stability of the filter, a consideration may be given only to influence effected by $g_{m4}$ capable of being provided with an arbitrary value. $D_B - 2N_{13}$ is found to be always stable since with regard to arbitrary positive $g_{m4}$, $D_B - 2N_{13}$ is a second order polynomial of Laplacian variable having only a positive coefficient.

In FIG. 7, a differential output signal and a low-pass output are provided respectively from nodes A and B. As OTA, as shown by FIG. 8, a conventionally-known CMOS transistor having differential voltage inputs 81 and 82 and single current output 83, is applicable and a differential transconductor is applicable.

When a value of transconductance $g_m$ of all of OTA is set to 39.52 μA/V and a capacitance value is set to 10 pF, there can be provided a second order filter having a cutoff frequency of 630 kHz and a Q value of 1. When a simulation is carried out by applying a device constant of a standard 1.2μCMOS process, there is achieved a common-mode rejection ratio equal to or larger than 60 dB in a pass band and the effectiveness of the embodiment is confirmed.

Figure 9:
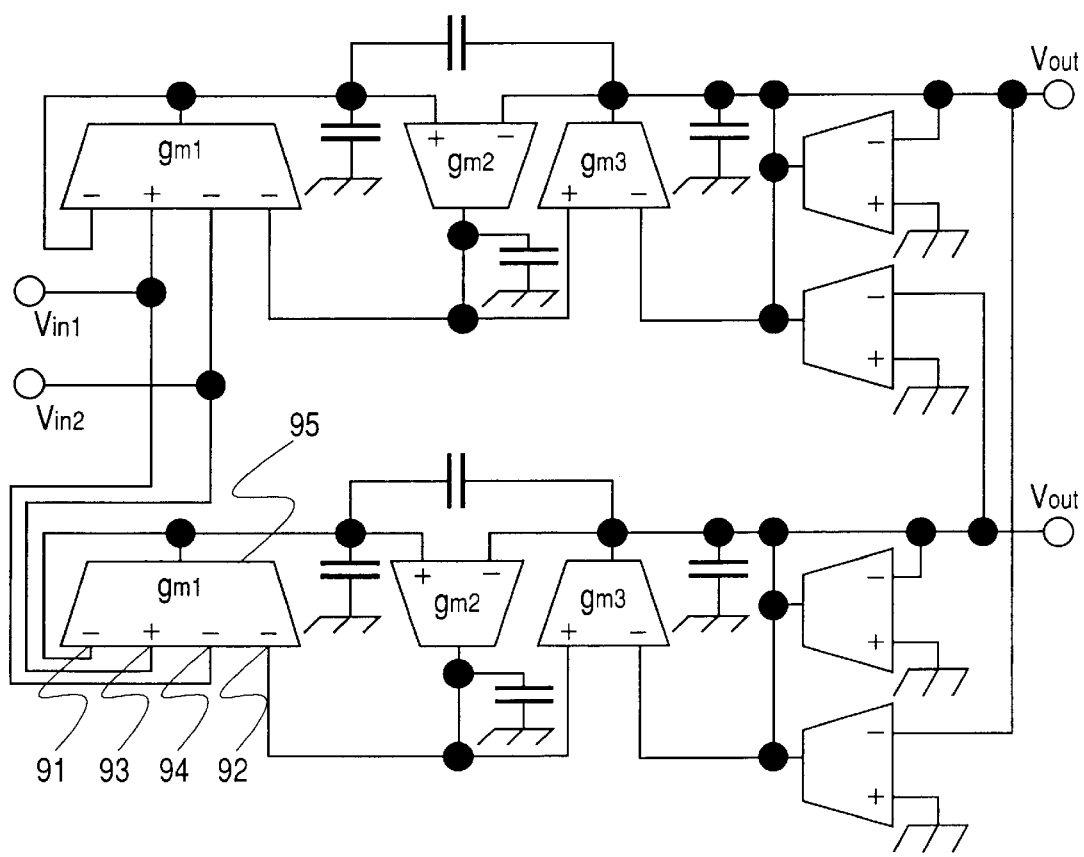
FIG. 9 is a block diagram of a third embodiment of the present invention in which a leap-frog type low-pass filter is fed back.

An explanation will be given of a third embodiment of the present invention in reference to FIGS. 9 and 10. FIG. 9 shows an example of applying a third order leap-frog type low-pass filter to $T_{11}$. In the drawing, a multi-input transconductor 95 is provided with three differential inputs. Numerals 93 and 94 designate a set of differential pair and numerals 91 and 92 designate ends on one side of differential inputs grounding respective pair of terminals.

Figure 10:
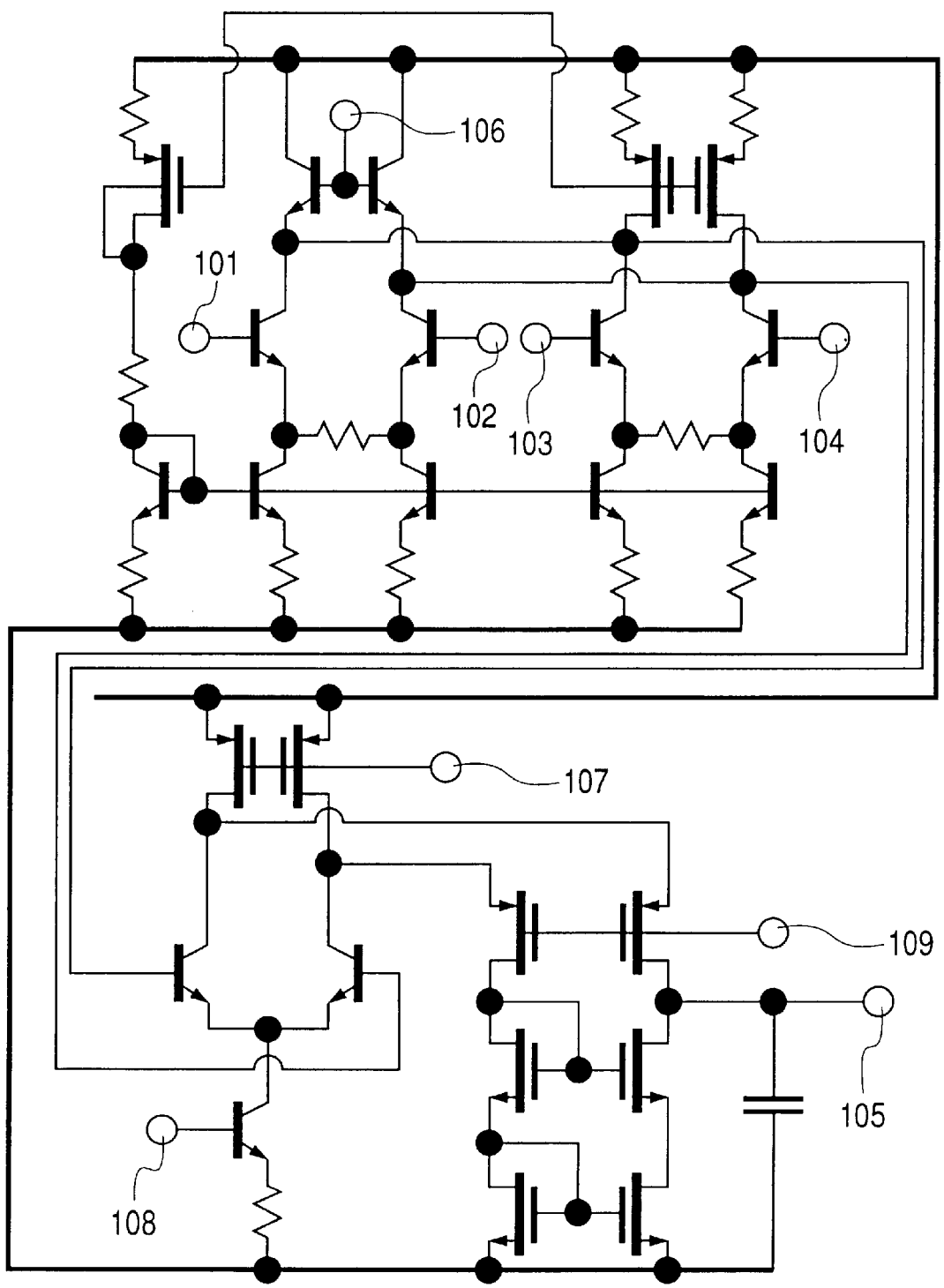
FIG. 10 is a circuit diagram showing a BiCMOS differential 2 input integrator applied to the third embodiment of the present invention.

FIG. 10 shows a specific circuit of a differential 2 input integrator as an example of a multi-input integrator. In this case, there is applied a process mixed with bipolar transistors and CMOS transistors. Numerals 101 and 102 constitute a first set of differential input terminals, and numerals 103 and 104 constitute a second set of differential input terminals. Numeral 105 designate a current output terminal and numerals 106 through 109 designate bias control terminals.

When a simulation is carried out by applying a device constant of a BiCMOS process of 0.6 μm, there is achieved a common-mode rejection ratio of 52 dB. Further, also when Monte Carlo method is applied and a resistance value in the circuit is dispersed by ±1% uncorrelatedly, there is achieved a common-mode rejection ratio equal to or larger than 42 dB. By the embodiment, there is realized the filter circuit achieving a large common-mode rejection ratio even when there is present a dispersion among elements.

An explanation will be given of a fourth embodiment of the present invention in reference to FIGS. 11 and 12. According to the embodiment, different from the second and the third embodiments, there is applied an integrator introduced in the first embodiment and feedback is provided to respective integrator constituting a filter.

Figure 11:
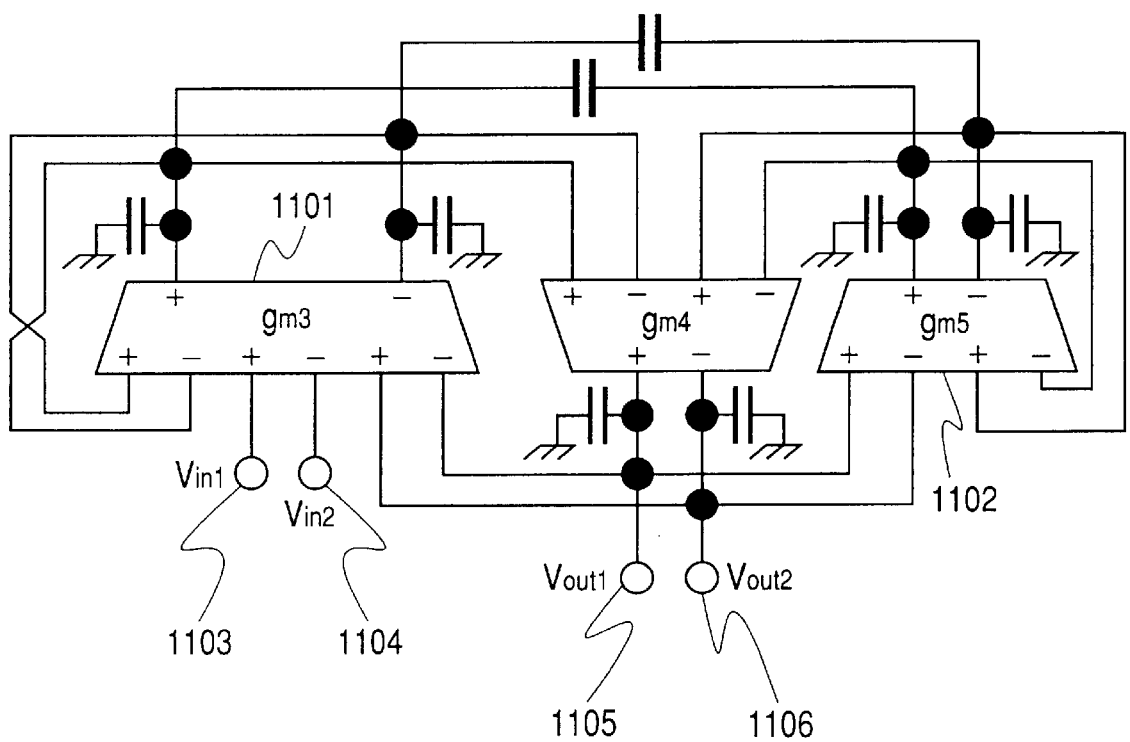
FIG. 11 is a block diagram showing a leap-frog type low-pass filter according to a fourth embodiment constituted by feeding back respective integrators.

FIG. 11 shows a total constitution of a filter. Signals are inputted from terminal pair 1103 and 1104 and outputs are taken from terminal pair 1105 and 1106. The filter is constituted by one 6 input integrator (differential 3 input) 1101 and two 4 input integrator (differential 2 input) 1102.

Figure 12:
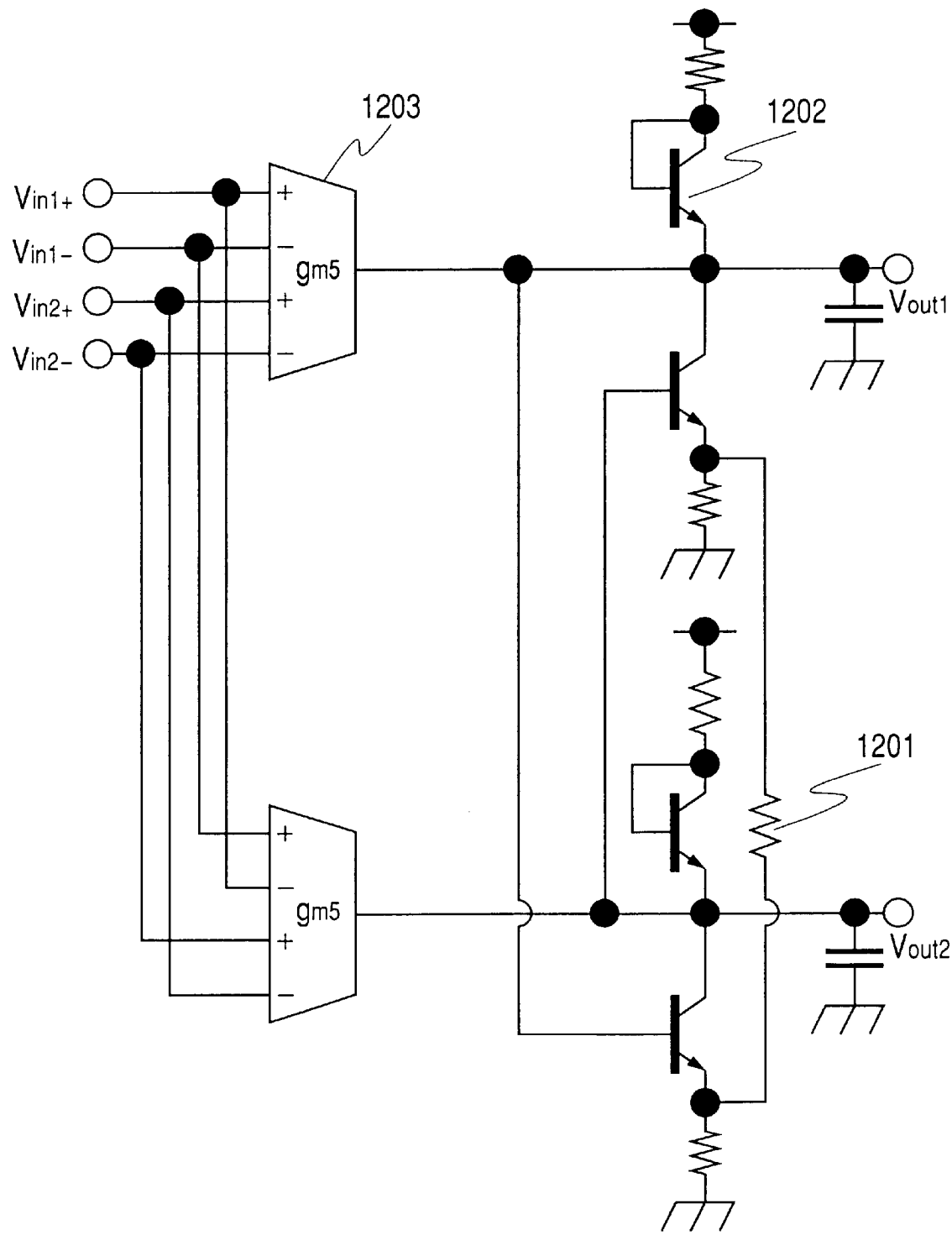
FIG. 12 is a block diagram showing a BiCMOS differential 2 input integrator having a feedback circuit applied to the fourth embodiment of the present invention.
Figure 13:
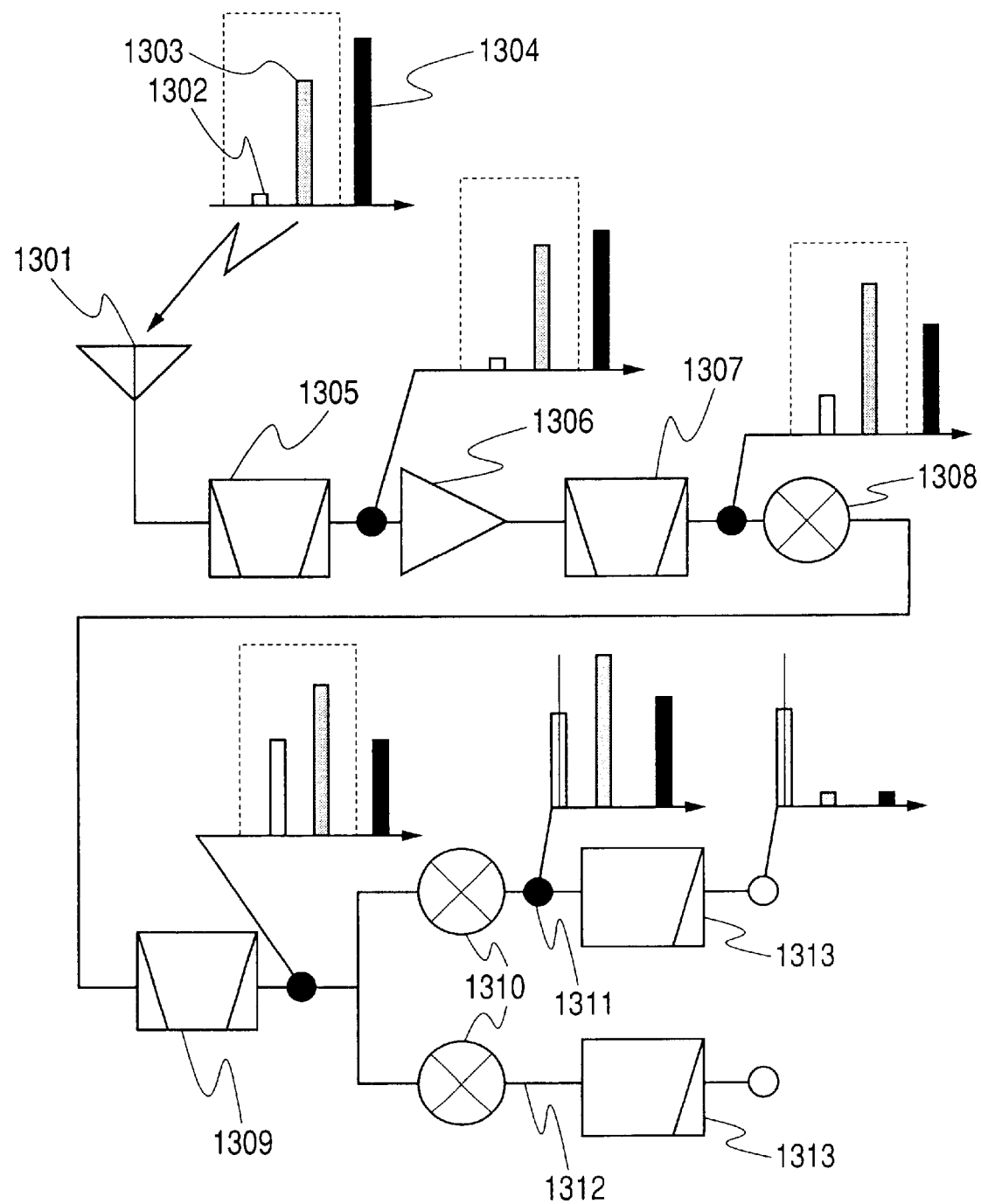
FIG. 13 is a block diagram of a receiving circuit for mobile communication and a diagram showing a relationship between received wave and blocking signal at respective stage.

The 4 input integrator is shown in FIG. 12. According thereto, two of integrators 1203 introduced in FIG. 10 of the third embodiment, are applied and feedback circuits are added. A feedback loop is added with an emitter coupling resistor 1201 and a transistor 1202 in diode connection for correcting impedance of the transistor based on the circuit constituted by a transistor and a resistor shown by FIG. 6.

Similar to the third embodiment, when a simulation is carried out by applying a device constant of BiCMOS process of 0.6 μm, there is achieved a common-mode rejection ratio equal to or larger than 105 dB in pass band. Further, even when Monte Carlo method is applied and a resistance value in the circuit is dispersed by ±1% uncorrelatedly, there is achieved a common-mode rejection ratio equal to or larger than 85 dB. According to the embodiment, the feedback is provided to the respective integrator and therefore, in comparison with the second and the third embodiments, although a circuit scale is enlarged, an excellent common-mode rejection ratio can be achieved.

An explanation will be given of a fifth embodiment of the present invention in reference to FIGS. 13 through 18. The embodiment realizes a base band filter for mobile communication. An explanation will be given of an outline of a signal processing at a receiving circuit in reference to FIG. 13. A signal inputted from an antenna 1301 includes not only a received signal 1302 but also an unnecessary blocking signal. The blocking signal includes an in-band blocking signal 1303 caused by the same application operation generated in a received frequency band and an off-band blocking signal 1304 by other application such as public broadcasting, business wireless or the like.

The signal inputted from the antenna passes through a first band-pass filter 1305. At this occasion, the off-band blocking signal is attenuated. The signal is amplified by a low noise amplifier 1306 and thereafter passes through a second band-pass filter 1307. Also in this case, only the off-band blocking signal is attenuated and the in-band blocking signal passes therethrough without being attenuated. The signal is converted into an intermediate frequency signal by a mixer circuit 1308 and thereafter passes through an intermediate frequency band-pass filter 1309. In this case, the off-band blocking signal is further attenuated and the in-band blocking signal is attenuated to some degree.

The signal is separated into an I signal 1311 and a Q signal 1312 by a modulator 1310. At this occasion, the received signal is included in from DC to a frequency of a half of an occupied band width and a signal of a frequency higher than the above-described frequency constitutes the unnecessary blocking signal. The intensity of the blocking signal in the base band may be that of a signal equal to or larger than 50 dB and rejection of the gigantic blocking signal poses a serious problem. Such a large signal is inputted to the received signal and therefore, it can be understood that a base band filter circuit 1313 needs to achieve a sufficiently large common-mode rejection ratio with allowance.

Figure 14:
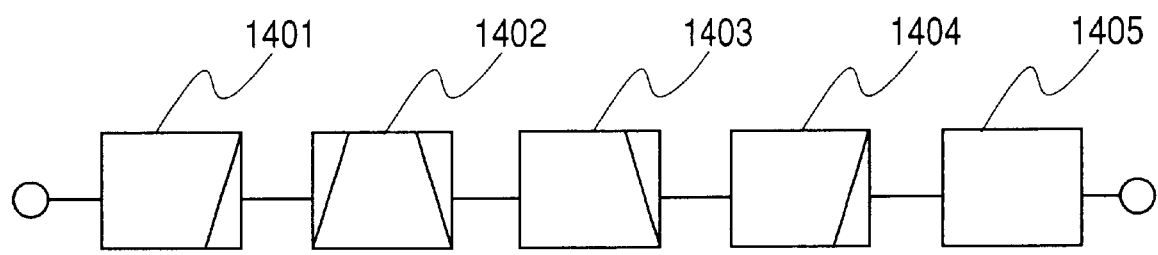
FIG. 14 is a block diagram showing filters according to a fifth embodiment of the present invention.

FIG. 14 shows a filter constitution of the embodiment. The constitution of the filter is constructed by a series connection of a first order low-pass filter (including output buffer amplifier) 1401, a second order notch filter 1402, a first order high-pass filter 1403, a third order leap-frog type low-pass filter 1404 and a first order all-pass filter 1405. Transfer functions of respective portions are, for example, as follows when normalized by a pass band frequency.

$$T_{int}(s) = \frac{1}{s+1} \quad \text{(Equation 37)}$$

$$T_{notch}(s) = \frac{0.0884817 \, (S^2 + 11.578)}{S^2 + 0.548325 s + 1.02445}$$

$$T_{diff}(s) = 0.5(1-s)$$

$$T_{leapfrog}(s) = \frac{0.1560886 \, (S^2 + 4.42243)}{(S^2 + 1.6754s + 1.19563)(s + 1.15469)}$$

$$T_{all}(s) = \frac{1-s}{s+1}$$

Here, notations $T_{int}$, $T_{notch}$, $T_{diff}$, $T_{leapfrog}$ and $T_{all}$ respectively designate transfer functions of the first order low-pass filter (including output buffer amplifier), the second order notch filter, the first order high-pass filter, the third order leap-frog type low-pass filter and the first order all-pass filter.

Figure 15:
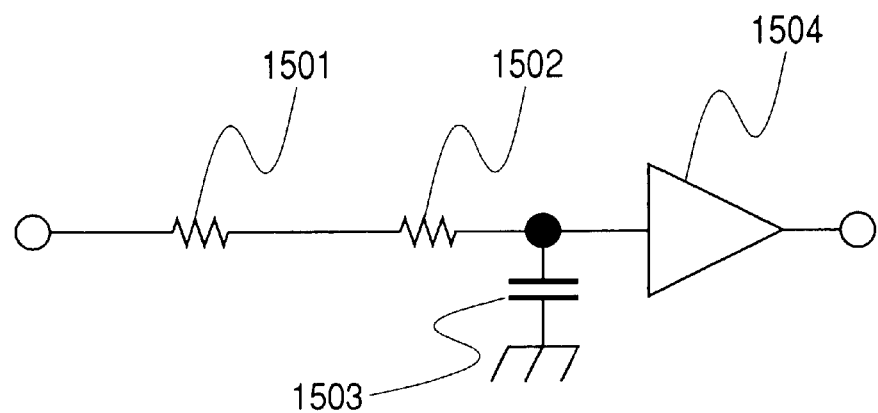
FIG. 15 is a circuit diagram of a first order low-pass filter applied to the fifth embodiment of the present invention.

As shown by FIG. 15, the first order low-pass filter is constituted by a signal source impedance 1501, a resistor 1502 and a capacitor 1503. Since the filter is a passive element, even when a signal having a large amplitude is inputted, the signal is not distorted. Further, since the signal having the large amplitude is a blocking signal having a high frequency, the signal can efficiently be attenuated by the first order filter and an amplitude of an input signal at a successive stage can be reduced. There is provided a buffer amplifier 1504 such that the time constant of the first order filter is not influenced by other circuit and the signal is transmitted to the successive stage.

Figure 16:
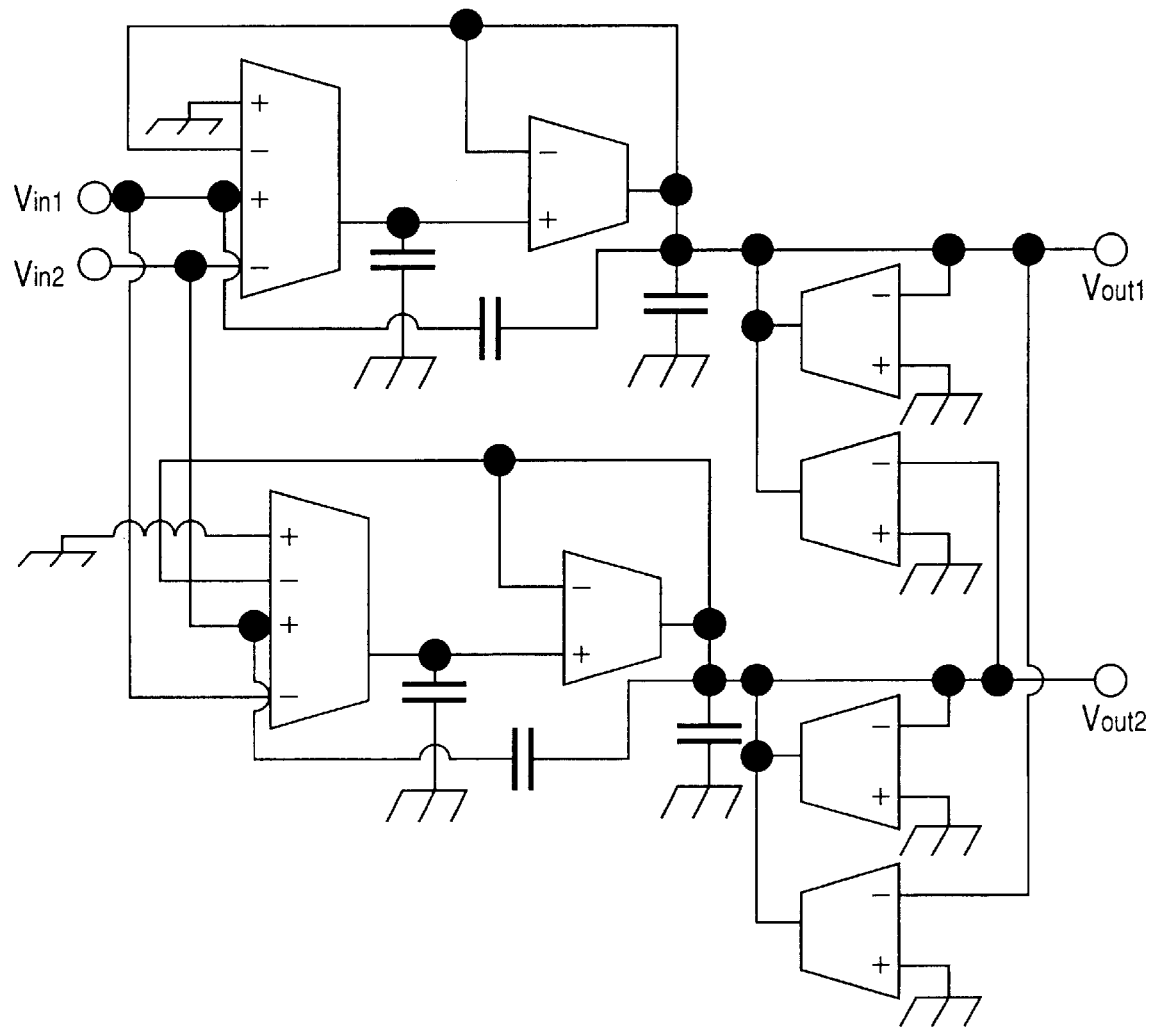
FIG. 16 is a block diagram showing a second order notch filter applied to the fifth embodiment of the present invention.

The second order notch filter is provided for making steep attenuation at outside of a band of the base band signal. FIG. 16 shows an example of the constitution. There is adopted a constitution similar to those of the second and the third embodiments in which the transfer function of the filter is made to correspond to $T_{11}$.

Figure 17:
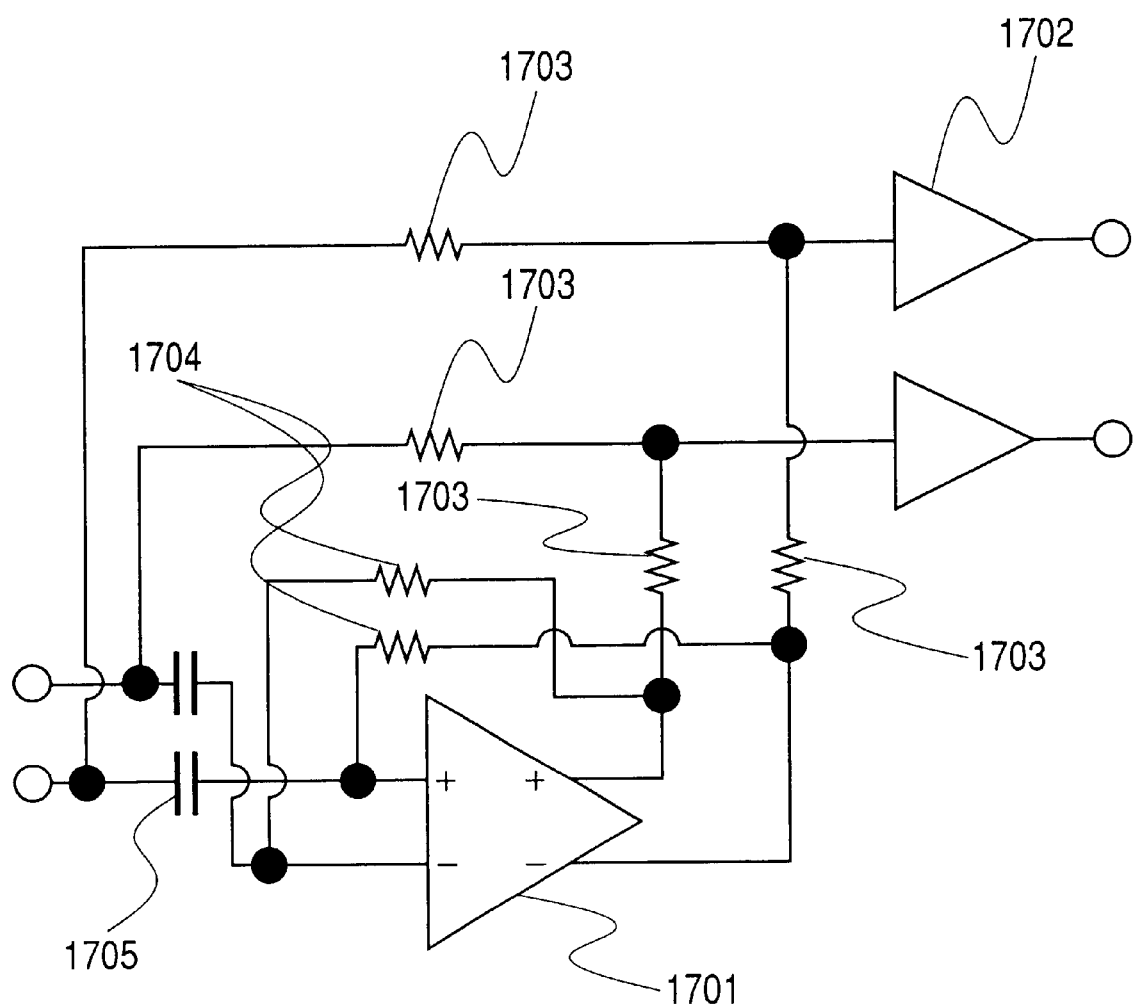
FIG. 17 is a circuit diagram showing a first order high-pass filter applied to the fifth embodiment of the present invention and FIG. 18 is a circuit diagram showing an all-pass filter applied to the fifth embodiment of the present invention.

The first order high-pass filter is connected successively. FIG. 17 shows an example of a circuit constitution. The filter is constituted by a differential operational amplifier 1701 and a buffer amplifier 1702, resistors 1703 and 1704 and a capacitor 1705. These are provided to cancel a variation in a cutoff frequency caused by a valuation in an element value of the first order low-pass filter at the initial stage. Therefore, it is necessary to use constituent elements of the resistors and the capacitor having structures the same as those of the first order low-pass filter. The circuit according to the third embodiment is applicable to the third order leap-frog type low-pass filter.

Figure 18:
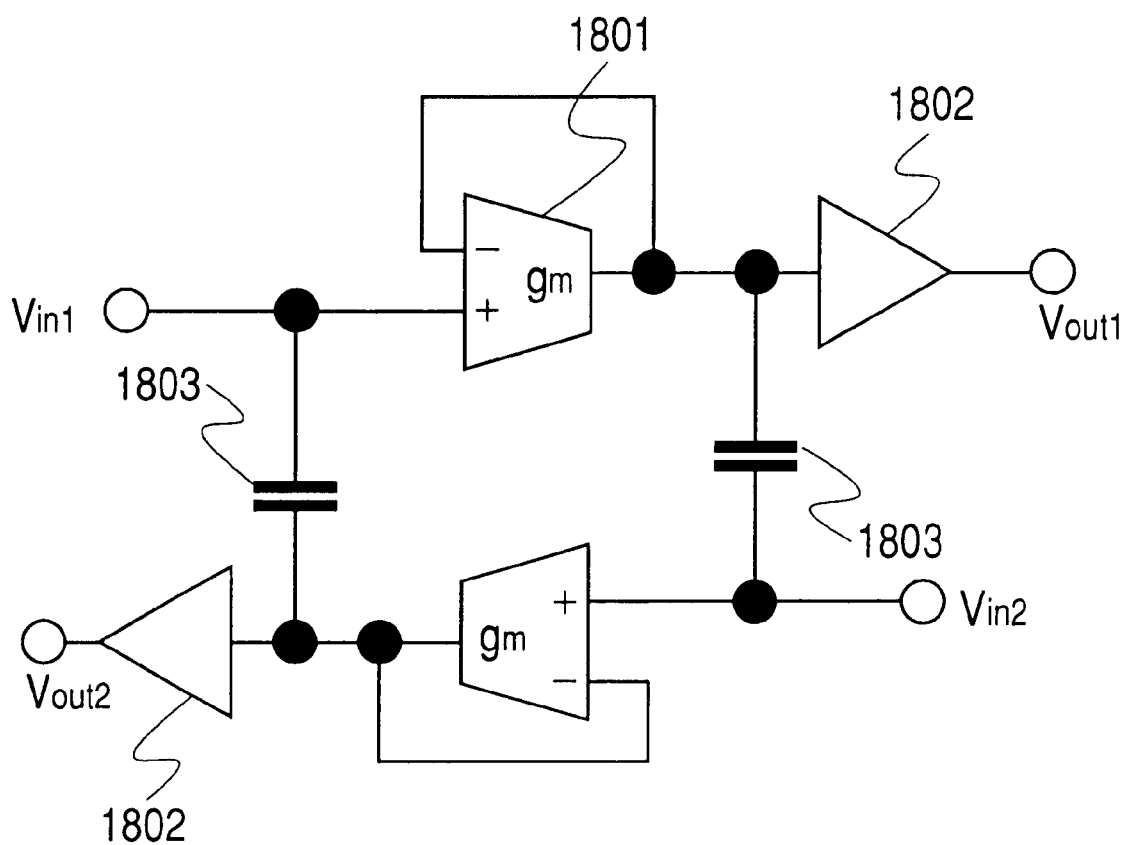

FIG. 18 shows an example of a constitution of the all-pass filter at the final stage. The all-pass filter is used for correcting a phase variation in the pass band. A minus polarity input terminal and an output terminal of OTA1801 are connected and used as a resistor. By the resistor and capacitors 1803 for controlling the phase, there is provided a circuit characteristic in which an amplitude characteristic is constant and the phase is changed. Buffer amplifiers 1802 are provided at circuit outputs to thereby reduce an influence effected on a filter time constant of a circuit at a successive stage.

When the above-described circuits are designed by assumedly setting the cutoff frequency to 1.25 MHz and a simulation is carried out by applying a device constant of a BiCMOS process of 0.6 µm similar to the third embodiment, there is provided a result of a maximum pass-band gain of 0 dB, an attenuation amount at 1.25 MHz of 2.92 dB, an attenuation amount at 2.5 MHz of 50.1 dB, a group delay variation of 0.17 µsec, a common-mode rejection ratio of 120 dB or more and a maximum input amplitude of 450 mV or more and the effectiveness of the embodiment is confirmed.

According to the invention, there can be realized the filter as well as the amplifier significantly improving the common-mode rejection ratio. The effect of improvement is confirmed in either of the cases or applying thereof to the CMOS process and the BiCMOS process by the simulation and the effect is confirmed also in the case of including the variation in elements.

Industrial Applicability

As has been described above, the semiconductor integrated circuit according to the present invention is useful as a circuit used in a system of transmitting a signal of a filter, an integrator, an amplifier or the like and is particularly suitable for being used in a wireless communication system.

What is claimed is:

1. A semiconductor integrated circuit comprising:
a plurality of electronic circuits, each of them having an input constituted by a single differential signal or a plurality of differential signals and an output of single phase,
wherein input polarities of a first one of the plurality of electronic circuits and a second one of the plurality of electronic circuits are inverted, and an output terminal of the first electronic circuit and an output terminal of the second electronic circuit are connected to a circuit of the plurality of electronic circuits having a function of suppressing a common-mode signal component between the two terminals and amplifying a differential signal,
wherein the circuit having the function is composed of a third one of the electronic circuits and a fourth one of the electronic circuits respectively having two input terminals, a first output terminal for receiving a signal provided by adding an output signal from the output terminal of the first electronic circuit and an output signal of the third electronic circuit, and a second output terminal for receiving a signal provided by adding an output signal from the output terminal of the second electronic circuit and an output signal of the fourth electronic circuit, and
wherein the first output terminal is connected to one of input terminals of the third electronic circuit, the second output terminal is connected to other input terminal of the third electronic circuit and the second output terminal is connected to one of input terminals of the fourth electronic circuit and the first output terminal is connected to other input terminal of the fourth electronic circuit.

2. The semiconductor integrated circuit according to claim 1, wherein when an electronic circuit of the plurality of electronic circuits constituting a constituent element inputs a plurality of input signals and outputs an output in proportion to a total sum of the inputs.

3. The semiconductor integrated circuit according to claims 1, wherein the electronic circuit constituting the constituent element is a transconductance circuit.

4. The semiconductor integrated circuit according to claim 2, wherein the electronic circuit constituting the constituent element is a transconductance circuit.

5. The semiconductor integrated circuit according to claim 3, wherein the input polarities of a first transconductance circuit and a second transconductance circuit are inverted, output terminals of a third transconductance circuit and a fourth transconductance circuit are connected to an output terminal of the first transconductance circuit, an input terminal having a negative polarity of the third transconductance circuit is connected to the output terminal of the first transconductance circuit, an input terminal having a positive polarity of the third transconductance circuit is grounded, an input terminal having a negative polarity of the fourth transconductance circuit is connected to an output terminal of the second transconductance circuit, an input terminal having a positive polarity of the fourth transconductance circuit is grounded, output terminals of a fifth and a sixth transconductance circuits are connected to the output terminal of the second transconductance circuit, an input terminal having a negative polarity of the fifth transconductance circuit is connected to the output terminal of the second transconductance circuit, an input terminal having a positive polarity of the fifth transconductance circuit is grounded, an input terminal having a negative polarity of the sixth transconductance circuit is connected to the output terminal of the first transconductance circuit and an input terminal having a positive polarity of the sixth transconductance circuit is grounded.

6. The semiconductor integrated circuit according to claim 4, wherein the input polarities of a first transconductance circuit and a second transconductance circuit are inverted, output terminals of a third transconductance circuit and a fourth transconductance circuit are connected to an output terminal of the first transconductance circuit, an input terminal having a negative polarity of the third transconductance circuit is connected to the output terminal of the first transconductance circuit, an input terminal having a positive polarity of the third transconductance circuit is grounded, an input terminal having a negative polarity of the fourth transconductance circuit is connected to an output terminal of the second transconductance circuit, an input terminal having a positive polarity of the fourth transconductance circuit is grounded, output terminals of a fifth and a sixth transconductance circuits are connected to the output terminal of the second transconductance circuit, an input terminal having a negative polarity of the fifth transconductance circuit is connected to the output terminal of the second transconductance circuit, an input terminal having a positive polarity of the fifth transconductance circuit is grounded, an input terminal having a negative polarity of the sixth transconductance circuit is connected to the output terminal of the first transconductance circuit and an input terminal having a positive polarity of the sixth transconductance circuit is grounded.

7. The semiconductor integrated circuit according to claim 5, wherein a first terminal of a first capacitor is connected to the output terminal of the first transconductance circuit, a second terminal of the capacitor is grounded, a first terminal of a second capacitor is connected to the output terminal of the second transconductance circuit and a second terminal of the capacitor is grounded.

8. The semiconductor integrated circuit according to claim 6, wherein a first terminal of a first capacitor is connected to the output terminal of the first transconductance circuit, a second terminal of the capacitor is grounded, a first terminal of a second capacitor is connected to the output terminal of the second transconductance circuit and a second terminal of the capacitor is grounded.

9. The semiconductor integrated circuit according to claim 5, wherein the first transconductance circuit and the second transconductance circuit are replaced by filter circuits each having a frequency characteristic and having differential inputs and a single phase output.

10. The semiconductor integrated circuit according to claim 6, wherein the first transconductance circuit and the second transconductance circuit are replaced by filter circuits each having a frequency characteristic and having differential inputs and a single phase output.

11. The semiconductor integrated circuit according to claim 7, wherein filters are constituted with the circuit as an integrator.

12. The semiconductor integrated circuit according to claim 8, wherein filters are constituted with the circuit as an integrator.

13. The semiconductor integrated circuit according to claim 3, wherein input polarities of a first transconductance circuit and a second transconductance circuit are inverted, a base of a first bipolar transistor is connected to an output terminal of the first transconductance circuit, a collector of the first transistor is connected to the output terminal of the second transconductance circuit, a base of a second bipolar transistor is connected to an output terminal of the second transconductance circuit and a collector of the second transistor is connected to the output terminal of the first transconductance circuit.

14. The semiconductor integrated circuit according to claim 4, wherein input polarities of a first transconductance circuit and a second transconductance circuit are inverted, a base of a first bipolar transistor is connected to an output terminal of the first transconductance circuit, a collector of the first transistor is connected to the output terminal of the second transconductance circuit, a base of a second bipolar transistor is connected to an output terminal of the second transconductance circuit and a collector of the second transistor is connected to the output terminal of the first transconductance circuit.

15. The semiconductor integrated circuit according to claim 13, wherein the first and the second bipolar transistors are replaced by field effect transistors.

16. The semiconductor integrated circuit according to claim 14, wherein the first and the second bipolar transistors are replaced by field effect transistors.

* * * * *